United States Patent [19]
Muehldorf

[11] 3,987,286
[45] Oct. 19, 1976

[54] TIME SPLIT ARRAY LOGIC ELEMENT AND METHOD OF OPERATION

[75] Inventor: Eugen Igor Muehldorf, Potomac, Md.

[73] Assignee: International Business Machines Corporation, Armonk, N.Y.

[22] Filed: Dec. 20, 1974

[21] Appl. No.: 534,944

[52] U.S. Cl. .............................. 235/152; 307/207; 328/92
[51] Int. Cl.² ........................................ H03K 19/20
[58] Field of Search ................... 235/152; 307/207; 328/92; 340/172.5

[56] References Cited
UNITED STATES PATENTS

| | | | |
|---|---|---|---|
| 3,579,119 | 5/1971 | Yau et al. | 328/92 |
| 3,731,073 | 5/1973 | Moylan | 235/152 |
| 3,816,725 | 6/1974 | Greer | 235/152 |
| 3,818,252 | 6/1974 | Chiba et al. | 307/207 |

OTHER PUBLICATIONS

D. Hutton & W. Kautz "A Simplified Summation Array for Cellular Logic Modules" IEEE Trans. on Computers Feb. 74 pp. 203–206.

*Primary Examiner*—David H. Malzahn
*Attorney, Agent, or Firm*—Joseph C. Redmond, Jr.

[57] ABSTRACT

A standard logic array can be electrically altered at different time intervals to execute complex logic functions. Input variables to the array are processed in a network to generate sets of implicants of a complex function in one or more time periods. The implicants constituting the function are processed through a logic network or matrix as the logic personality of the matrix is altered. The implicant and logic networks may be personalized by (a) structure, (b) time signals, (c) personality signals, and (d) any combination of (a), (b) and (c). The standard array executes complex functions in a single time period or by processing one or more implicants in groups at different time periods. The testability of the array may be improved by appropriate interconnections of the array elements. The invention reduces the number of logic elements or part numbers a system designer must assemble to achieve desired objectives for a data processing machine. The arrays can be produced, stockpiled and structurally personalized at a later time as required by a system designer. The method of operating the array is compatible with data processing machine programming and operation.

11 Claims, 9 Drawing Figures

ARRAY CONFIGURATION FOR TIME SPLIT LOGIC

LOGIC MACRO BLOCK

ARRAY CONFIGURATION
FOR TIME SPLIT LOGIC

FIG. 3A — $S = \bar{A}\bar{B}C + \bar{A}B\bar{C} + A\bar{B}\bar{C} + ABC$

FIG. 3B — $C_{OUT} = \bar{A}BC + A\bar{B}C + AB\bar{C} + ABC$

FIG. 3C — $M = \bar{A}BC + \bar{A}B\bar{C} + AB\bar{C}$

TIME SPLIT ARRAY LOGIC ELEMENT AND METHOD OF OPERATION

BACKGROUND OF THE INVENTION

1. Field of the Invention

This invention relates to logical networks. More particularly, the invention relates to integrated array logic that is (a) electrically personalized as a function of time, and/or (b) fixed in a semiconductor material.

2. Description of the Prior Art

Integrated logic networks are of two general types. The first type is randomly arranged logic elements that may be discrete or integrated AND, OR an Invert elements which are connected as desired and to which electrical signals are supplied to achieve a logical result. A second logic network is array logic. A matrix of logical elements can be assembled to provide fixed answers, e.g., a table lookup for a plurality of input signals. Both logic networks have certain advantages and disadvantages. The random logic elements can be densely packed and the speed of logic execution can be optimized. However, random logic elements require significant inventory or stockpiling to have available the required logic functions for data processing system designers to achieve desired objectives. Also, there is significant design turnaround time required to generate a new logic function. System design and development is hampered by the long lead time in fabricating new logic elements. Array logic, in contrast, has few part numbers and permits fast turnaround time in designing new data processing systems. However, array logic requires significantly more semiconductor area than random logic to perform a desired logic function. Execution time for a logic function may also be longer in an array logic element than in a random logic element.

Array logic elements are generally of two types. One type has a fixed personality which is set in manufacture, as for example, read-only or read-mostly memories. A second array logic type is programmable whereby output signals are returned to the input of an array to alter the logic outputs. Array logic elements permit complex logic functions to be easily designed. Array logic elements that require minimum semiconductor area and few part numbers will permit improvements in the performance and versatility of small data processing systems.

SUMMARY OF THE INVENTION

An object of the invention is a universal logic element for large scale integrated semiconductors.

Another object is an integrated logic element that may be repeatedly personalized in executing complex logic function.

Another object is an array logic element that may be time shared by input signals definitive of a complex logic function.

Another object is an array logic element that may be functionally controlled to process input signals definitive of a complex logic function.

Another object is a time split array logic element for executing complex logic functions.

Another object is a time split array logic element that may be electrically personalized during one or more time intervals to execute a complex logic function.

Another object is an array logic element that has improved testability.

Another object is a process for executing complex logic functions in a standard array.

Another object is a process for improved testing of standard array logic elements.

In an illustrative embodiment of the invention, one or more input signals are provided as variables to a standard array. The outputs from the array may be one or more complex logic function, as for example, Sum, Carry, and two out of three vote. The input signals are processed by a decoder, which in one form, partitions the input signals as single or double bit or like combinations. The partitioned signals are appropriately converted in a first network into the implicants of the logic function to be executed by the array. The implicants are generated by the implicant network in sets associated with a time interval. Each set of implicants is provided as an input to a logic matrix or network. The matrix is divided into areas or sections for executing different logic functions. Each logic section includes a register for receiving personality signals to alter the condition of the logic elements in the section. Sets of personality signals are provided as first inputs to the personality registers associated with the logic sections. Simultaneously, the prime implicants are provided as second inputs to the logic elements in the section. The outputs from the logic elements are provided as inputs to a storage circuit for combination with succeeding outputs from the logic elements during subsequent time intervals. The outputs appearing at the storage elements at the end of the time intervals represent the executed complex functions.

The standard array is operated by providing steady state binary values as input variables to the decoder over a logic cycle which may be divided into $t_n$ intervals where n is any integer. The decoder partitions the input signal for application to an implicant network. Simultaneously, personality signals are introduced into the personality registers. A clock is supplied as an input to the implicant network to provide the first set of implicants to the respective sections of the logic network. In the next time interval, the outputs from the logic elements are stored for subsequent combination with the next set of outputs from the logic elements. The personality registers are shifted to provide the next personality signals to the logic elements in the next time interval. A second clock signal is provided to supply the next set of implicants to the logic elements. The outputs from the logic elements are combined with the previously stored output to complete the execution of the logic function defined by the signals definitive of the implicants.

In another form, the decoder output is provided to an implicant network comprising a matrix of logic elements and storage registers which may be personalized according to the implicants desired to be generated as inputs to the logic array. The personality signals for the implication network enables a complex logic function to be executed in a minimum of time sequences. The personality signals for the implicant network optimizes the generation of the implicants for a selected function. It also increases the number of logic functions that may be performed by an array for input signals to the decoder.

In still another form, the personality registers may be appropriately linked together to improve the testability of the logic matrix. The personality registers may be loaded with a predetermined bit pattern that is adapted to generate related output signals in the storage circuits of the array. The correlation between the personality signals as they are stepped through the array and the output signals appearing in the storage register permits the array to be functionally tested.

A feature of the invention is an implicant network, logic network or matrix and personality register for executing a complex logic function in timed sequences, combining the logic outputs to complete execution of the logic function at the end of the timed sequences.

Another feature is a logic network or matrix, divided into sections for processing a plurality of complex functions, each section including a storage register for repeatedly personalizing the logic section in successive time intervals.

Another feature is a decoder for bit partitioning of input signals and an implicant network that is adapted to generate sets of implicants in successive timing intervals.

Still another feature is an implicant network responsive to input signals and personality signals to provide sets of implicants in successive timing intervals based upon the personality signals.

Another feature is a logic matrix and associated personality registers adapted to receive test patterns for generating defined output signals from the logic network in successive timing intervals based upon selected input signals to the matrix.

BRIEF DESCRIPTION OF THE DRAWINGS

These and other features will be more fully apprehended from the following detailed specifications taken in conjunction with the appended drawings in which:

FIGS. 3A, 3B and 3C are Karnaugh maps of representative logic functions processed by the array of FIG. 2.

DESCRIPTION OF PREFERRED EMBODIMENT

Figure 1:
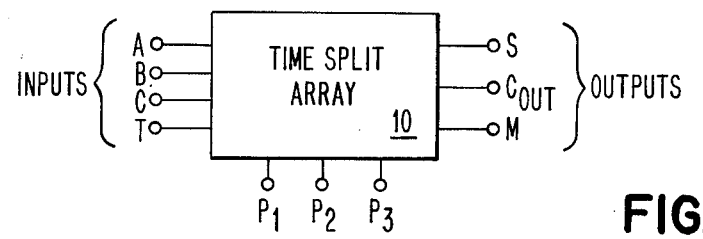
FIG. 1 is a block diagram of a time split array for executing a plurality of logic functions in response to variable input signals, timing signals and personality signals.

In FIG. 1, a plurality of binary input signals A, B and C are processed by a time split array 10 to obtain their Sum (S), Carry ($C_{OUT}$) and two out of three vote (M) at the end of a logic cycle defined by a plurality of timing signals appearing on an input line T. Personality signals P1, P2 and P3 are provided as inputs to the array 10. The signals P1, P2 and P3 alter the logic configuration of the array, as timing or clock signals appear on the line T. It should be understood the invention is not limited to executing three logic functions based upon three input variables. The invention, as will appear hereinafter, can execute any number of logic functions for any number of input variables over logic cycles of any number of timing intervals. The present embodiment has been selected solely for ease in explanation of the invention.

Figure 2:
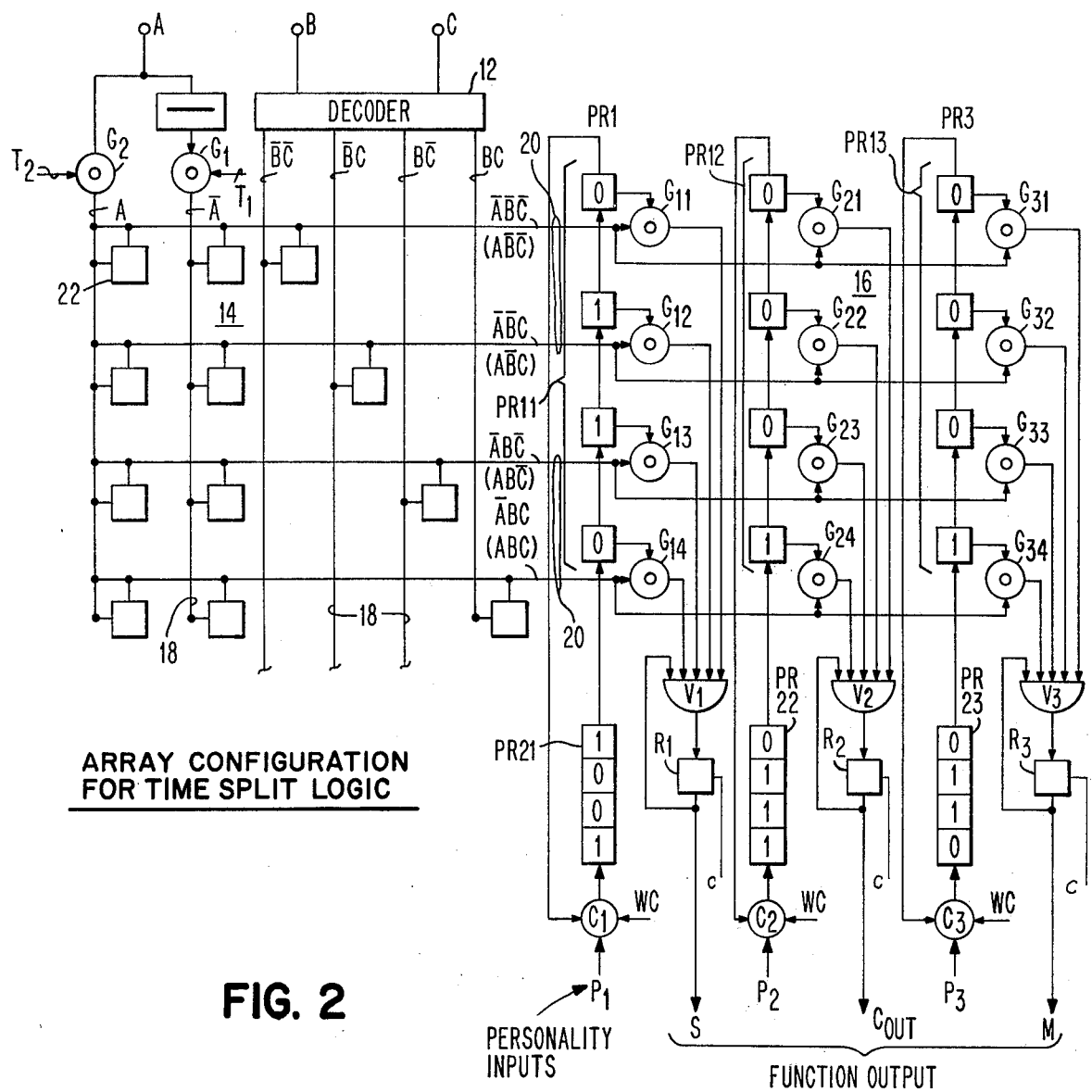
FIG. 2 is an example of an electrical schematic of a time split array shown in FIG. 1.

FIG. 2 shows the array 10 as comprising a decoder network 12, implicant network 14, logic matrix 16, personality registers PR11, 21, 12, 22, 13 and 23, and output circuits S, $C_{OUT}$ and M.

The bit decoder 12 is adapted to partition the input variables in any desired form. The present decoder employs a single bit partition for the input variable to generate a true and complement for A and A, respectively. A two bit partitioner processes the input variables B and C into the binary combinations BC, BC, BC and BC. Timing signals T1 and T2 are combined with the partioned signals A and A as first and second inputs to the implicant network 14. The two bit partitioned signals of the input variables B and C are supplied as third, fourth, fifth and sixth input signals to the implicant network 14.

The partitioned signals are supplied as inputs to vertical lines 18 which form one axis of the network 14. The input signals to the matrix 16 form the horizontal lines 20 or the other axis of the network 14. Fixed logic elements 22 are connected between appropriate crosspoints of the network 14 depending upon the complex function(s) to be processed. In one form, the elements 22 are conventional AND circuits. A set of implicant signals is generated for each timing interval. One set of implicant signals appears above the lines 20 for one time signal (T1) and the other set of implicant signals appear below the lines 20 for the other time signal (T2). The matrix 16 is divided into sections G11-G14, G21-G24 and G31-G34, respectively. The logic elements G11...G34 are conventional AND gates, electrically alterable, responsive to a first signal from the implicant network 14 and a personality signal from a stage of the personality register. Each personality register includes a control gate C1, C2 or C3. The signal inputs to the control gates are personality signals P1, P2 and P3, respectively and a write control (WC) signal. The output signal from each logic element is multipled to an output circuit associated with the respective section. The output circuits for the section G11-G14 comprise a gate V1 and a storage element R1 including a feedback loop to the output gate. Similarly, the output circuits $C_{OUT}$ and M for the logic sections G21-G24 and G31-G34, respectively, are multipled to output gates V2 and V3 including storage registers R2 and R3, respectively.

Figures 3D, 4:
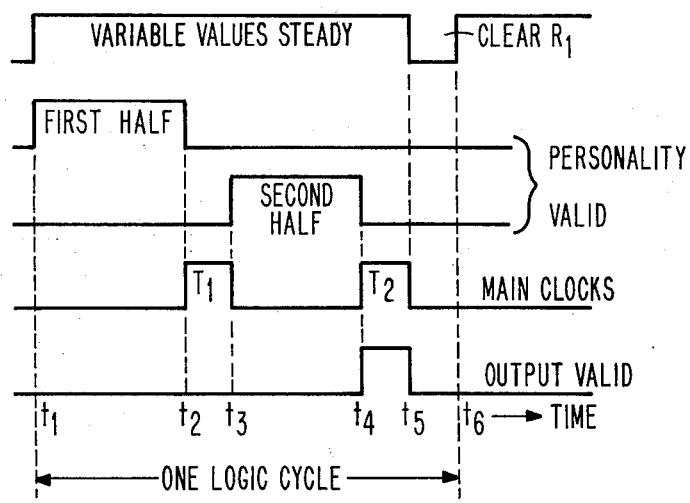
FIG. 3D is a matrix of personality signals supplied to the array of FIG. 2 based upon the Karnaugh maps of FIGS. 3A, 3B and 3C for their related logic function Sum (S), Carry ($C_{OUT}$), and Majority (M), respectively.
FIG. 4 is a timing diagram for processing the functions of FIGS. 3A, 3B and 3C in the array of FIG. 2.

The array of FIG. 2 will now be described for generating the Sum (S), Carry ($C_{OUT}$) and two out of three vote (M). FIG. 3A shows the standard Boolean equation for summing 3 binary input signals. The Karnaugh map shows the summation signals for the respective binary combinations. The summation or mapping signals are supplied as the personality signals (P1) to the logic section in FIG. 2 performing the S function. Similarly, FIG. 3B shows the Boolean equation for generating the Carry ($C_{OUT}$) function. The Karnaugh map shows the Carry signals for the respective binary combinations. The Carry or mapping signals are supplied on the personality signals (P2) to logic section in FIG. 2 performing the $C_{OUT}$ function. FIG. 3C shows the Boolean equation for the two out of three vote (M). The Karnaugh map shows the respective output signals for the various binary combination. The Majority or mapping signals are supplied as the personality signals (P3) to the logic section in FIG. 2 performing the M vote. FIG. 3D summarizes the coefficients or output signals for the Sum (S), Carry ($C_{OUT}$) and Majority (M) functions defined by the implicants or min-terms of the respective functions.

FIG. 2 will now be described in conjunction with FIG. 4 for executing the Sum, Carry and two out of three vote for signal variables A, B and C as a first input and the personality signals P1 (S), P2 ($C_{OUT}$), and P3 (M), as shown in FIG. 3D, as the second input to the array in FIG. 2. The logic functions S, $C_{OUT}$ and M are processed in a logic cycle of five (5) time periods (t1 - t6) including (T1, T2) two clock signals, as shown in FIG. 4. The first clock signal (T1) permits one-half of the implicants for functions S, $C_{OUT}$ and M to be processed and stored. The second clock signal (T2) permits the remaining implicants of each logic function to be processed and combined with the stored signal to generate output signals definitive of the executed logic functions for the respective input signals A, B and C. A clear (C) signal is introduced into the cells R1, R2 and R3 at the end of T2.

During the interval t1 and t2, one half of the personality signals for the functions S, $C_{OUT}$ and M are entered through gates C1, C2 and C3 under a suitable control signal WC as the first input to the AND gates G11-G14; G21-G24 and G31-G34 of the respective logic sections. Between t2 and t3 the clock T1 activates signal A and the min-terms as indicated above the lines 20 are generated as second inputs to the AND gates in the matrix 16. The logic products from the AND gates are OR'D together in the gates V1, V2 and V3. The results are stored in the storage elements R1, R2 and R3 and represent the first part of the functions S, $C_{OUT}$ and M, respectively after T1 drops. In the interval between t3 and t4, the personality of the logic gates G11-G14, G21-G24 and G31-G34 is changed by shifting the personality patterns in the registers PR21, 22 and 23 into the registers PR11, 12 and 13. The shifting means (not shown) are well known in the art. Simultaneously, under control of the signal WC, the first part of the personality in the registers PR11, 12 and 13 is recycled into the registers PR21, 22 and 23, provided the personality is to be retained. Alternatively, a new personality may be read into the registers PR21, 22 and 23 for subsequent entry into the registers PR11, 12 and 13. Between the t4 and t5, the clock T2 activates signal A and the min-terms shown below the lines 20 are generated and applied to the logic elements of the matrix 16. The resulting logic products from the AND gates are OR'D with the result from the previous operation available in the cells R1, R2 and R3 by utilizing the feedback paths from the cells to the gates V1, V2 and V3. The final result appearing in the registers R1, R2 and R3 is now available as valid output for the S, $C_{OUT}$ and M functions until T2 drops. Between t5 and t6, the storage cells, R1, R2 and R3 are cleared and the input variables are allowed to change.

It should be understood the array of FIG. 2 may process more or less than 3 input variables. Also, the array may be arranged to process more or less than 3 logic functions. As noted before, the particular circuit described in FIG. 2 was selected solely for ease in explanation.

Figure 5:
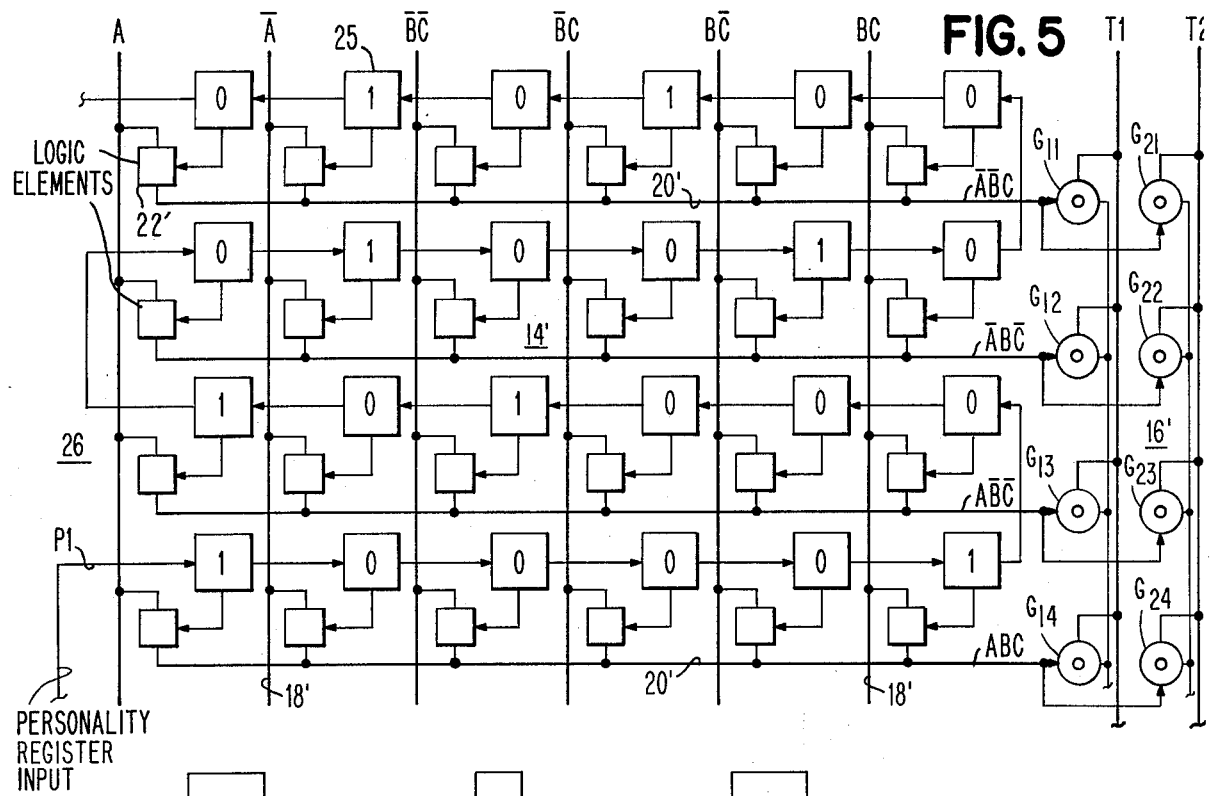
FIG. 5 is an electrical schematic of an implicant network that may be substituted in the array of FIG. 2.

FIG. 5 shows a substitue implicant network 14' for the corresponding network in FIG. 2. Elements in FIG. 5 corresponding to those in FIG. 2 will be assigned the same reference character but will be primed. The partitioned signals are supplied as inputs to vertical lines 18' which are one axis of the network 14'. The implicants generated by the network appear on the horizontal lines 20' which form the other axis of the network. A logical element 22', typically an AND circuit, is connected between each crosspoint of the network. Each logical element 22' is associated with a register stage 25 and the stages are serially linked together as a personality register 26. The implicant network 14' permits a function to be executed in the matrix 16' in one time interval rather than a plurality of time intervals provided the network and the matrix have sufficient lines to generate and process the implicants, respectively. The personality register 26 is loaded with a bit pattern P1 during the time period t1 - t2 or t3 - t4. The bit pattern in the register 26 is adapted to generate the required implicants for executing a function. Briefly, the AND circuits 22' receiving 1's provide outputs to the line 20'. Outputs to the matrix 16' are provided on a line 20' when two or more logic elements 22' are operated. The implicants appearing at the input of the matrix 16' provide a valid output at the associated register R1 or the like (not shown) at the end of T1 as well as at the end of T2. Personality signals are not provided to the matrix 16'. Instead, a different timing signal T1, T2, T3 (not shown) is provided to G11-G14, G22-G24 and G31-G34 (not shown), respectively.

The implicant network 14' permits the array 10 to be controlled by the architecture and programming for a data processing machine. The invention describes machine architecture with general logic circuits that permits logic microfunctions, e.g., adders, comparators and the like to be changed for specific data processing applications by program control. Application programs for a data processing machine can appropriately load the personality registers 11, 12, 13, 21, 22, 23 and 26 to execute machine functions in single or multiple time intervals of the array cycle.

The array 10, as modified by FIG. 5, can be fabricated as a universal part for application to a wide range of data processing applications. Design and development of data processing systems for new applications should be simiplified by the availability of a universal logic element. Also, stockpiling and engineering changes to the universal part should be simplified.

It can be shown that the semiconductor area for an array 10 tends to increase as the square of the number of functions that can be executed by the array. The array area, however, can be reduced by performing the different functions in different array regions of dense personalization. It can be shown further that the area of dense array personalization may be reduced as the square of the time periods is increased for a logic cycle. Briefly, the AND circuits 22' receiving 1's provide outputs to the line 20'. Outputs are provided on a line 20' when two or more logic elements 22' are operated. Thus, doubling the time periods for executing a logic function reduces the matrix area as the square root. Similarly, guadrupling the time periods for executing a logic function reduces the matrix area as the fourth root. The reduced matrix area for executing a logic function is offset by the additional area required for the personality register 26, shown in FIG. 5.

Figure 6:
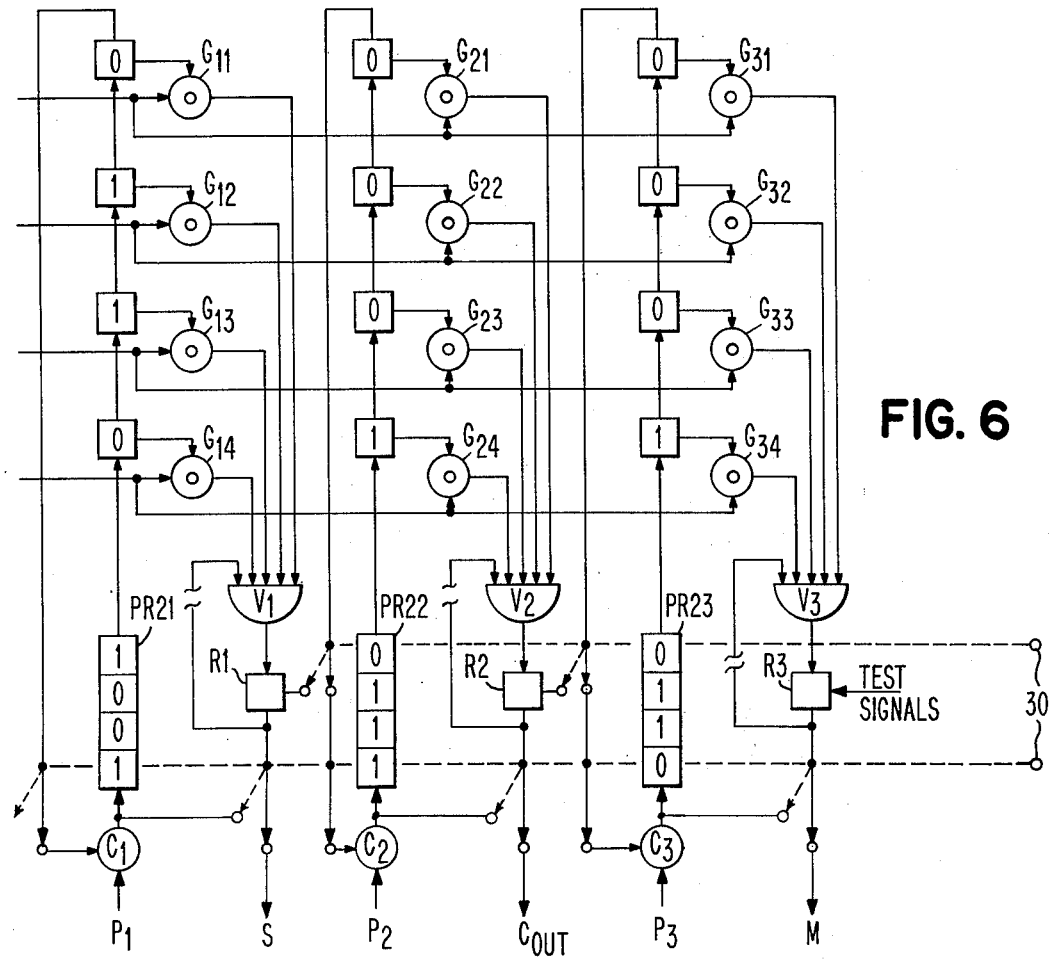
FIG. 6 is an electrical schematic of the array of FIG. 2 modified to improve testability of the array.

The array 10 may be adapted for improved functional testability, as shown in FIG. 6. One technique for improving testability of logic elements is described in U.S. Pat. No. 3,761,695 assigned to the present assignee. Briefly, each logical element is a combination of logic and storage circuitry. The storage circuitry has the capability for performing scan-in/scan-out independent of the system input/output and controls. The testing method provides for the state of the storage circuitry to be preconditioned independent of prior history. Test patterns from an automatic test generator are cycled through the networks of logic and their respective associated storage circuitry for removal through the scan arrangement to determine their fault status. In FIG. 6, a double throw, single pole switching element 30 is incorporated into the feedback paths to the personality registers PR21, 22 and 23 and the storage circuits R1, R2 and R3. The switch 30 may be operated to serially link the personality registers 11, 21, 12, 22, 13, and 23 and the storage circuits R1, R2 and R3. When the personality registers are serially linked the testing procedure described in U.S. Pat. No. 3,761,695 can be executed.

The array 10 is readily fabricated in semiconductor material. Standard planar processing is employed to fabricate the logic and storage elements in bipolar or MOSFET technology, as described, for example, in U.S. Pat. No. 3,508,209 or 3,590,477 both assigned to the present assignee. For bipolar technology, the array may be fabricated using NPN or PNP devices. Similarly, the array may be fabricated in MOSFET technology using P or N channel devices employing an enhance or deplete mode of operation. The logic elements for the networks 14, 14', 16 and 16' may take other configurations than the AND or OR.

While the invention has been shown and described with respect to particular embodiments, it will be understood by those skilled in the art that the foregoing and other changes in form and detail may be made therein without departing from the spirit and scope of the invention.

What is claimed is:

1. A logic array for executing complex logic functions comprising:
   a. an array comprising an implicant network connected to a logic network,
   b. a first set of input terminals connected to the array, the first set of terminals adapted to receive first signals definitive of variables of a complex logic function,
   c. a second set of input terminals connected to the array, the second set of terminals adapted to receive second signals for personalizing the array to execute a complex logic function,
   d. a timing terminal connected to the array, the timing terminal adapted to receive third signals for controlling the array in generating output signals definitive of the executed complex logic function, and
   e. means connected to the logic network to store an output from the logic network and to combine the stored output with further outputs from the logic network.

2. The logic array of claim 1 further including decoder means for translating the first signal set into partitioned signals for application to the implicant network.

3. The logic array of claim 1 wherein the implicant network includes alterable logic elements and the logic network includes fixed logic elements.

4. The logic array of claim 1 wherein the implicant network includes fixed logic elements and the logic network includes alterable logic elements.

5. The logic array of claim 4 further including decoder means for translating the input signal set to partitioned signals for application to fixed logic elements in the implicant network which generates half the implicant signal of a complex logic function for each timing signal.

6. A logic array for executing complex logic functions comprising:
   a. an array comprising an implicant network connected to a logic network,
   b. terminals for receiving a set of input signals connected to the implicant network, the input signals definitive of the variables of a complex logic function to be executed by the array,
   c. terminals for receiving personalizing signals, the terminals coupled to the implicant network, means included in the implicant network responsive to the personalizing signals in combination with the input signals for initiating output signals to the logic network, the output signals definitive of the implicants of the complex logic function,
   d. timing terminals coupled to the logic network and receiving timing signals and means included in the logic network responsive to each timing signal in combination with an implicant signal set initiating logic output signals from the logic network, and
   e. output circuits for combining the output signals from the logic network and providing an output signal from the array definitive of the executed complex logic functions at the end of the timing signals.

7. The logic array of claim 6 wherein the output circuit comprise a gate for receiving logic signals from the logic network and an element for storing the gate output and providing a feedback path to the gate.

8. A logic array for executing complex logic functions comprising:
   a. an array comprising a first network connected to a second network,
   b. a set of input terminals connected to the first network, the terminals receiving a set of input signals definitive of the variables of a complex logic function to be executed by the array,
   c. timing terminals coupled to the first network and receiving timing signals and means included in the first network responsive to each timing signal in conjunction with the input signals for initiating from the first network an implicant signal set as an input to the second network,
   d. terminals for receiving personalizing signal sets, the terminals coupled to the second network, means included in the second network responsive to each personalizing signal set in combination with an implicant signal set for initiating logic signals from the second network, and
   e. an output circuit for storing the successive logic signals from the second network and providing output signals definitive of the executed complex logic functions at the end of a selected time interval defined by the number of timing signals.

9. A process for executing a complex logic function comprising the steps of
   a. generating a first set of signals indicative of variables of a selected complex logic function and providing the first set of signal to an array,
   b. generating a set of personality signals and providing the personality signals as a second input to the array,
   c. generating timing signals as a further input to the array, d. generating a set of implicants of a logic function as a first partial output from the array, e. generating the remaining implicants of a complex logic function as a second partial output from the array, and f. providing an output signal from the array definitive of the executed complex logic functions upon the appearance of successive timing signals.

10. A process for executing complex logic functions comprising the steps of a. generating input signals as variables of a complex logic function for input to a logic array, b. generating a timing signal as another input to the array to obtain output signals from the array, c. storing the output signals for subsequent processing, d. generating a second timing signals to obtain further outputs from the array, and e. combining the first and further output to obtain a signal indicative of the executed complex logic function.

11. A logic array for executing complex logic function and having improved testability comprising:

a. an array comprising an implicant network connected to a logic network, b. a set of input terminals connected to the implicant network and receiving input signals, the input signal set definitive of variables of a selected complex logic function to be executed by the array, c. timing terminals coupled to the implicant network and receiving timing signals, means included in the implicant network responsive to the input and timing signals to initiate sets of implicant signals to the logic network, the implicant signal set being definitive of the implicants of the selected complex logic function, d. personality registers coupled to the logic networks and responsive to personality signals, means included in the logic network responsive to the personality signals in conjunction with the sets of implicant signals for generating output signals from the logic network, e. an output circuit for combining the successive logic output signals, and f. means for connecting the personality registers and output circuits in series to improve testability of the array.

* * * * *